(12) United States Patent
Tiwari et al.

(10) Patent No.: US 10,580,491 B2
(45) Date of Patent: Mar. 3, 2020

(54) SYSTEM AND METHOD FOR MANAGING PEAK POWER DEMAND AND NOISE IN NON-VOLATILE MEMORY ARRAY

(71) Applicant: Silicon Storage Technology, Inc., San Jose, CA (US)

(72) Inventors: Vipin Tiwari, Dublin, CA (US); Hieu Van Tran, San Jose, CA (US); Nhan Do, Saratoga, CA (US); Mark Reiten, Alamo, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 112 days.

(21) Appl. No.: 16/015,020

(22) Filed: Jun. 21, 2018

(65) Prior Publication Data

US 2019/0295647 A1 Sep. 26, 2019

Related U.S. Application Data

(60) Provisional application No. 62/647,573, filed on Mar. 23, 2018.

(51) Int. Cl.
*G11C 5/08* (2006.01)
*G11C 16/04* (2006.01)
*H01L 27/11521* (2017.01)
*H01L 29/788* (2006.01)
*H01L 29/423* (2006.01)

(52) U.S. Cl.
CPC .... *G11C 16/0425* (2013.01); *H01L 27/11521* (2013.01); *H01L 29/42328* (2013.01); *H01L 29/7885* (2013.01)

(58) Field of Classification Search
CPC ... G11C 13/0069; G11C 8/08; G11C 13/0002; G11C 13/003; G11C 2213/79; G11C 13/004; G11C 2213/71; G11C 5/025; G11C 2013/0073; G11C 11/4085; G11C 16/04–16
See application file for complete search history.

(56) References Cited

U.S. PATENT DOCUMENTS

| | | |
|---|---|---|
| 5,029,130 A | 7/1991 | Yeh |
| 5,602,784 A | 2/1997 | Kojima et al. |
| 6,363,000 B2 * | 3/2002 | Perner ............... G11C 11/15 365/173 |
| 7,315,056 B2 | 1/2008 | Klinger et al. |
| 7,382,657 B2 | 6/2008 | Hayashi et al. |
| 7,868,375 B2 | 1/2011 | Liu et al. |

(Continued)

*Primary Examiner* — Hien N Nguyen
(74) *Attorney, Agent, or Firm* — DLA Piper LLP US

(57) ABSTRACT

A memory device includes rows and columns of memory cells, word lines each connected to a memory cell row, bit lines each connected to a memory cell column, a word line driver connected to the word lines, a bit line driver connected to the bit lines, word line switches each disposed on one of the word lines for selectively connecting one memory cell row to the word line driver, and bit line switches each disposed on one of the bit lines for selectively connecting one memory cell column to the bit line driver. A controller controls the word line switches to connect only some of the rows of memory cells to the word line driver at a first point in time, and controls the bit line switches to connect only some of the columns of memory cells to the bit line driver at a second point in time.

22 Claims, 5 Drawing Sheets

(56) References Cited

U.S. PATENT DOCUMENTS

| | | |
|---|---|---|
| 8,305,806 B2 | 11/2012 | Choi et al. |
| 8,400,864 B1 | 3/2013 | McCombs |
| 9,672,930 B2 * | 6/2017 | Tran ................ G11C 16/30 |
| 10,373,686 B2 * | 8/2019 | Tran ................ G11C 16/08 |
| 2002/0114181 A1 | 8/2002 | Shau |
| 2015/0348626 A1 * | 12/2015 | Nakayama .......... H01L 45/04 |
| | | 365/51 |

* cited by examiner

SYSTEM AND METHOD FOR MANAGING PEAK POWER DEMAND AND NOISE IN NON-VOLATILE MEMORY ARRAY

RELATED APPLICATIONS

This application claims the benefit of U.S. Provisional Application No. 62/647,573 filed on Mar. 23, 2018, and which is incorporated herein by reference.

FIELD OF THE INVENTION

The present invention relates to non-volatile memory arrays.

BACKGROUND OF THE INVENTION

Non-volatile memory devices are well known in the art. For example, a split-gate memory cell is disclosed in U.S. Pat. No. 5,029,130. This memory cell has a floating gate and a control gate disposed over and controlling the conductivity of a channel region of the substrate extending between source and drain regions. Various combinations of voltages are applied to the control gate, source and drain to program the memory cell (by injecting electrons onto the floating gate), to erase the memory cell (by removing electrons from the floating gate), and to read the memory cell (by measuring or detecting the conductivity of the channel region to determine the programming state of the floating gate).

The configuration and number of gates in non-volatile memory cells can vary. For example, U.S. Pat. No. 7,315,056 discloses a memory cell that additionally includes a program/erase gate over the source region. U.S. Pat. No. 7,868,375 discloses a memory cell that additionally includes an erase gate over the source region and a coupling gate over the floating gate.

FIG. 1 illustrates a split gate memory cell 10 with spaced apart source and drain regions 14/16 formed in a silicon semiconductor substrate 12. A channel region 18 of the substrate is defined between the source/drain regions 14/16. A floating gate 20 is disposed over and insulated from a first portion of the channel region 18 (and partially over and insulated from the source region 14). A control gate (also referred to as a word line gate or select gate) 22 has a lower portion disposed over and insulated from a second portion of the channel region 18, and an upper portion that extends up and over the floating gate 20 (i.e., the control gate 22 wraps around an upper edge of the floating gate 20).

Memory cell 10 can be erased by placing a high positive voltage on the control gate 22, and a reference potential on the source and drain regions 14/16. The high voltage drop between the floating gate 20 and control gate 22 will cause electrons on the floating gate 20 to tunnel from the floating gate 20, through the intervening insulation, to the control gate 22 by the well-known Fowler-Nordheim tunneling mechanism (leaving the floating gate 20 positively charged or more positively charged—the erased state). Memory cell 10 can be programmed by applying a ground potential to drain region 16, a positive voltage on source region 14, and a positive voltage on the control gate 22. Electrons will then flow from the drain region 16 toward the source region 14, with some electrons becoming accelerated and heated whereby they are injected (by hot electron injection) onto the floating gate 20 (leaving the floating gate negatively charged or more negatively charged—the programmed state). Memory cell 10 can be read by placing ground potential on the drain region 16, a positive voltage on the source region 14 and a positive voltage on the control gate 22 (turning on the channel region portion under the control gate 22). If the floating gate is positively charged (erased), electrical current will flow from source region 14 to drain region 16 (i.e. the memory cell 10 is sensed to be in its erased "1" state based on sensed current flow). If the floating gate 20 is negatively charged (programmed), the channel region under the floating gate is weakly turned on or turned off, thereby reducing or preventing any current flow (i.e., the memory cell 10 is sensed to be in its programmed "0" state based on sensed low or no current flow).

FIG. 2 illustrates an alternate split gate memory cell 24 with same elements as memory cell 10, but additionally with a program/erase (PE) gate 26 disposed over and insulated from the source region 14 (i.e. this is a three gate design). Memory cell 24 can be erased by placing a high voltage on the PE gate 26 to induce tunneling of electrons from the floating gate 20 to the PE gate 26. Memory cell 24 can be programmed by placing positive voltages on the control gate 22, PE gate 26 and source region 14, and a current on drain region 16, to inject electrons from the current flowing through the channel region 18 onto floating gate 20. Memory cell 24 can be read by placing positive voltages on the control gate 22 and drain region 16, and sensing current flow.

FIG. 3 illustrates an alternate split gate memory cell 28 with same elements as memory cell 10, but additionally with an erase gate 30 disposed over and insulated from the source region 14, and a coupling gate 32 over and insulated from the floating gate 20. Memory cell 28 can be erased by placing a high voltage on the erase gate 30 and optionally a negative voltage on the coupling gate 32 to induce tunneling of electrons from the floating gate 20 to the erase gate 30. Memory cell 28 can be programmed by placing positive voltages on the control gate 22, erase gate 30, coupling gate 32 and source region 14, and a current on drain region 16, to inject electrons from the current flowing through the channel region 18 onto floating gate 20. Memory cell 28 can be read by placing positive voltages on the control gate 22 and drain region 16 (and optionally on the erase gate 30 and/or the coupling gate 32), and sensing current flow.

For all the above referenced memory cells, they are typically operated in a digital manner, meaning that voltages are applied in each of the program, erase and read operations to program the memory cells to a "0" state, erase the memory cells to a "1" state, and to read the memory cells to determine whether they are in the programmed state or the erased state. In digital operations, each memory cell can only store one bit of data (i.e., the cell has only two possible programming states), which are read by placing the memory cell above its read threshold whereby it will conduct the read current if not programmed with electrons, and it will not conduct (or conduct very little) if programmed with electrons.

It is also possible to operate the above described memory cells in an analog manner, whereby each memory cell can be programmed to one of many programming states, which is determined by reading the memory cell using a subthreshold read operation. Specifically, each memory cell can be gradually programmed with electrons until a desired programming state is achieved. During a read operation, the memory cell read voltage(s) are selected to place the memory cell in a sub-threshold state (i.e., the read voltage(s) are insufficient to turn the memory cell on no matter its programmed state), so that any current through the channel region of the memory cell represents sub-threshold leakage current. However, that subthreshold leakage current will be proportional to the programming state of the memory cell, and therefore indicative of the programming state of the memory cell. Therefore, in this manner, the memory cells can be used in an analog manner whereby they are programmed to an analog programming state and produce an analog read current that is proportional to the analog programming state. Analog operation is ideal for applications such as neural nets, where the memory cells are used to store individual weight values, and the array is used to perform vector/matrix multiplication (i.e., the neuron layer inputs are placed on the word lines, and are effectively multiplied by the weights stored in the individual memory cells to produce the outputs on the bit lines).

In digital operation, an entire row of memory cells is usually read in a single read operation. This means that not only is the word line activated to its read voltage, but each of the bit lines for that row of memory cells are activated too during the read operation. The peak current demand for digital operation is therefore dictated by the electrical current requirements needed to activate the one word line and all the bit lines. In analog operation, however, all of the word lines and bit lines could be activated simultaneously (e.g., during a vector/matrix multiplication operation). This means that the peak current demand by the memory array in analog operation could be many times that of digital operation. High peak current demand can result in excessive power supply noise which can cause device malfunction, a significant voltage drop which also can cause device malfunction, and detrimental effects for devices powered by RF energy. Sources of the current demand include large word line drivers, bit-line pre-charging, differential op-amps for differential current sensing, and activation. In all cases, voltage and current supplies need to handle the peak voltage and current requirements for operating the memory array, making these devices larger and consume more power.

There is a need for a non-volatile memory array architecture and design that reduces peak power demand and noise.

BRIEF SUMMARY OF THE INVENTION

The aforementioned problems and needs are addressed by a memory device that includes a plurality of memory cells arranged in rows and columns, a plurality of word lines each connected to a row of the memory cells, a plurality of bit lines each connected to a column of the memory cells, a word line driver connected to the word lines, a bit line driver connected to the bit lines, a plurality of word line switches each disposed on one of the word lines for selectively connecting and disconnecting one of the rows of memory cells to and from the word line driver, a plurality of bit line switches each disposed on one of the bit lines for selectively connecting and disconnecting one of the columns of memory cells to and from the bit line driver, and a controller configured to control the plurality of word line switches to connect some but not all of the rows of memory cells to the word line driver at a first point in time, and control the plurality of bit line switches to connect some but not all of the columns of memory cells to the bit line driver at a second point in time.

A memory device includes a plurality of memory cells arranged in rows and columns, a plurality of word lines each connected to a row of the memory cells, a plurality of bit lines each connected to a column of the memory cells, a word line driver connected to the word lines, a bit line driver connected to the bit lines, a plurality of word line switches each disposed on one of the word lines for selectively connecting and disconnecting one of the rows of memory cells to and from the word line driver, and a controller configured to control the plurality of word line switches to connect some but not all of the rows of memory cells to the word line driver at a first point in time.

A memory device includes a plurality of memory cells arranged in rows and columns, a plurality of word lines each connected to a row of the memory cells, a plurality of bit lines each connected to a column of the memory cells, a word line driver connected to the word lines, a bit line driver connected to the bit lines, a plurality of bit line switches each disposed on one of the bit lines for selectively connecting and disconnecting one of the columns of memory cells to and from the bit line driver, and a controller configured to control the plurality of bit line switches to connect some but not all of the columns of memory cells to the bit line driver at a first point in time.

A method of operating a memory device, where the memory device includes a plurality of memory cells arranged in rows and columns, a plurality of word lines each connected to a row of the memory cells, a plurality of bit lines each connected to a column of the memory cells, a word line driver connected to the word lines, a bit line driver connected to the bit lines, a plurality of word line switches each disposed on one of the word lines for selectively connecting and disconnecting one of the rows of memory cells to and from the word line driver, and a plurality of bit line switches each disposed on one of the bit lines for selectively connecting and disconnecting one of the columns of memory cells to and from the bit line driver. The method includes operating the plurality of word line switches to connect some but not all of the rows of memory cells to the word line driver at a first point in time, and operating the plurality of bit line switches to connect some but not all of the columns of memory cells to the bit line driver at a second point in time.

Other objects and features of the present invention will become apparent by a review of the specification, claims and appended figures.

DETAILED DESCRIPTION OF THE INVENTION

Electrical power and current demands for operating the memory array can be reduced by selectively grouping certain components that are operated together at certain points in time, and operating that group of components together to the exclusion of others during certain operations. In doing so, the components that supply electrical current and voltage can be reduced in size and complexity, and will consume less power.

Figure 4:
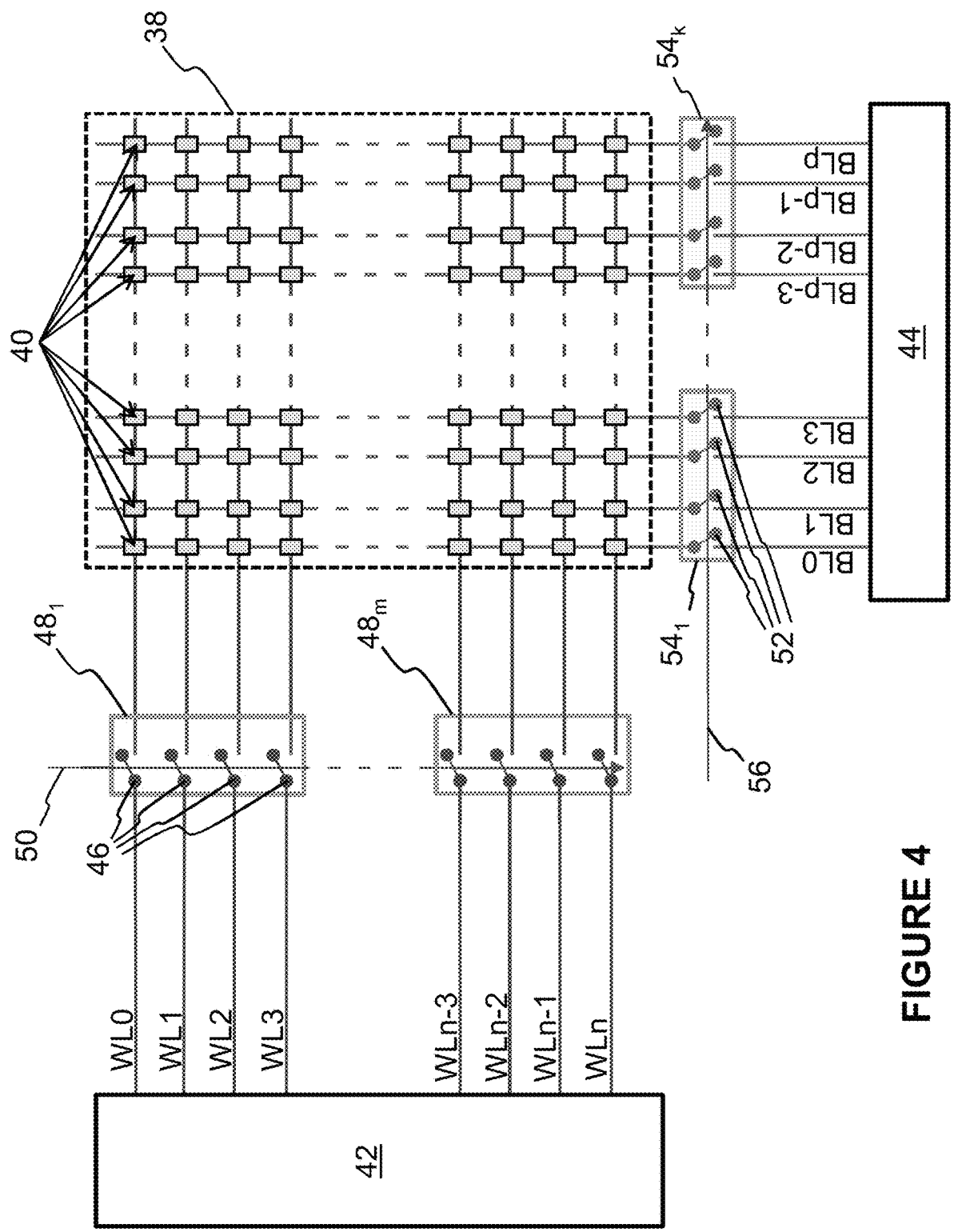
FIG. 4 is a schematic view of the memory array configuration of the present invention.

FIG. 4 illustrates the memory array configuration of the present invention, and is applicable to any of the previously described memory cell configurations. A memory array 38 includes memory cells 40 arranged in rows and columns. Word lines WL0, WL1, . . . WLn-1, and WLn extend in the row direction and are driven by word line driver 42. Bit lines BL0, BL1, . . . BLp-1, and BLp extend in the column direction, and are driven by bit line driver 44. The bit line driver 44 not only includes circuitry for driving voltages/currents onto the bit lines, but also sense amplifier circuitry for sensing the voltages/currents on the bit lines. Each memory cell 40 is located at an intersection of one of the word lines WL and one of the bit lines BL. Each of the word lines WL0-WLn is connected to and/or forms the control gates (also called the word line gates or the select gates) for an entire row of the memory cells 40. Each of the bit lines BL0-BLp is connected to the drain regions for an entire column of the memory cells 40.

Each word line WL includes a switch (WL switch 46) that selectively passes or blocks incoming signals on the word line WL from the word line driver 42. Specifically, each switch has a closed or connected state where it will conduct or pass signals there through, and an open or disconnected state where it will not conduct or pass signals there through. The word line switches 46 can be clustered in groups $48_1$, $48_2$, . . . $48_m$), where all of the word line switches 46 in each group are operated together. The word line switches 46 are opened (to block signals) and closed (to pass signals) in response to control signals on one or more WL switch control lines 50.

Each bit line BL includes a switch (BL switch 52) that selectively passes or blocks signals on the bit line to/from the bit line driver 44. Specifically, each switch has a closed or connected state where it will conduct or pass signals there through, and an open or disconnected state where it will not conduct or pass signals there through. The bit line switches 52 can be clustered in groups $54_1$, $54_2$, . . . $54_k$), where all of the bit line switches 52 in each group are operated together. The bit line switches 52 are opened (to block signals) and closed (to pass signals) in response to control signals on one or more BL switch control lines 56.

The present invention manages and controls peak current/power demand by selectively controlling the WL switches 46 on the word lines WL, and the BL switches 52 on the bit lines BL. Specifically, only some of the WL switches 46 are activated (closed) at a point in time to pass voltages/currents from the word line driver 42 to just some of the word lines WL. Similarly, only some of the BL switches 52 are activated (closed) at a point in time to pass voltages/currents between the bit line driver 44 and just some of the bit lines BL. By having some but not all of the WL switches 46 and/or some but not all of the BL switches 52 closed at one time, the peak current demand by the memory array is reduced. This reduction in peak current demand can be achieved by activating one or more, but not all, of the groups 48 of WL switches 46 at one time. Similarly, this reduction in peak current demand can be achieved by activating one or more, but not all, of the groups 54 of BL switches 52 at one time.

For example, certain operations call for the bit lines to be pre-charged to a specific voltage. During such an operation, one or more but not all of the groups 54 of the BL switches 52 can be activated (closed) so that only some of the bit lines are pre-charged at one time (i.e. a first point in time) by the bit line driver 44. The other bit lines can be pre-charged at later time(s) (i.e., at one or more other points in time different from the first point in time). In another example, the sense amplifier circuitry can include differential sense amplifiers each of which detects the difference in voltage between two of the bit lines. The BL switches 52 can be used to sequentially activate different groups 54 of bit lines connected to different differential sense amplifiers in the bit line driver 44 at different times. In yet another example, the word lines and bit lines are discharged of voltage (i.e., by coupling to ground) during certain operations. The WL switches 46 and/or BL switches 52 can be successively closed at different times during this operation, so that only some of the lines are discharged at one time (which reduces ground noise). This can be done individually (switch by switch) or by groups (group by group, groups by groups, etc.). In any of the above examples, the response from an operation involving one group of switches can be an input trigger to another group of switches.

The number of word lines WL and bit lines BL in each switch group 46/54 can vary depending on the peak current demands of the device. Alternately, the switches can be operated individually without being operated in groups. The above described WL switches 46 and BL switches 52 allow for simplification of the design and operation of the word line driver 42 and the bit line driver 44.

Figure 1:
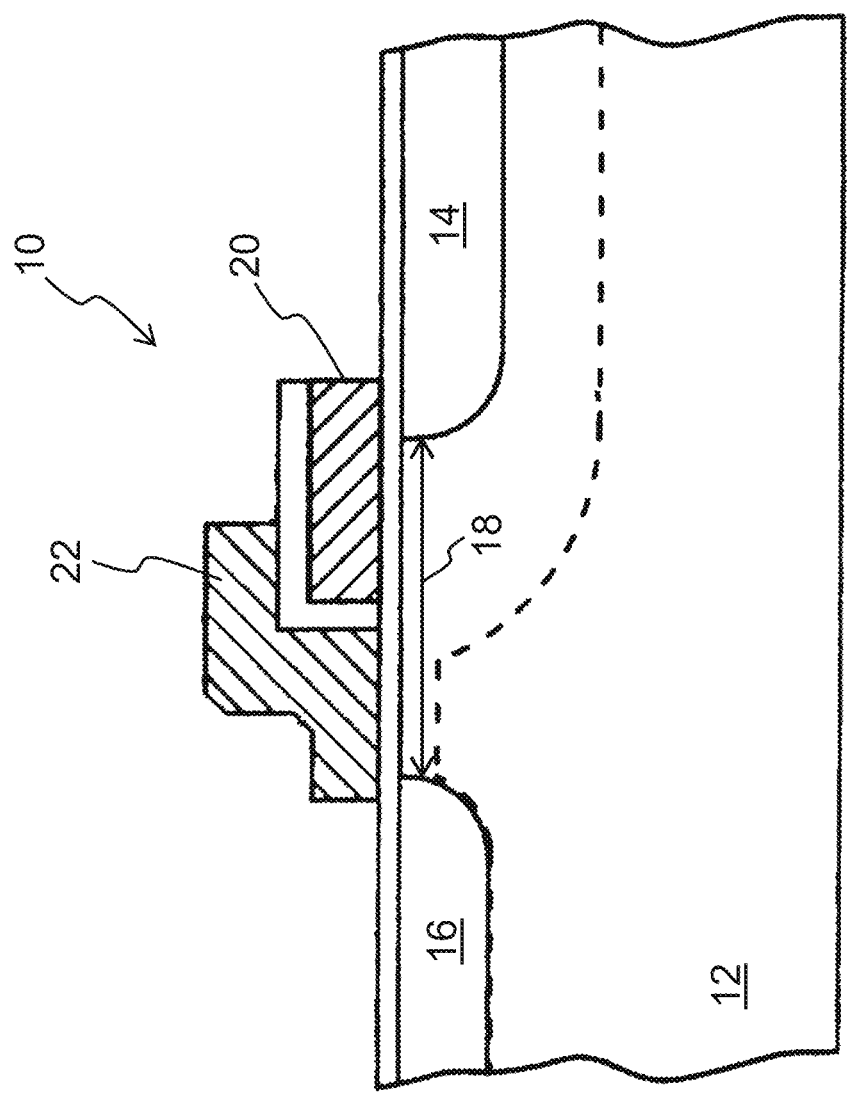
FIG. 1 is a side cross sectional view of a conventional split gate memory cell having two conductive gates.
Figure 2:
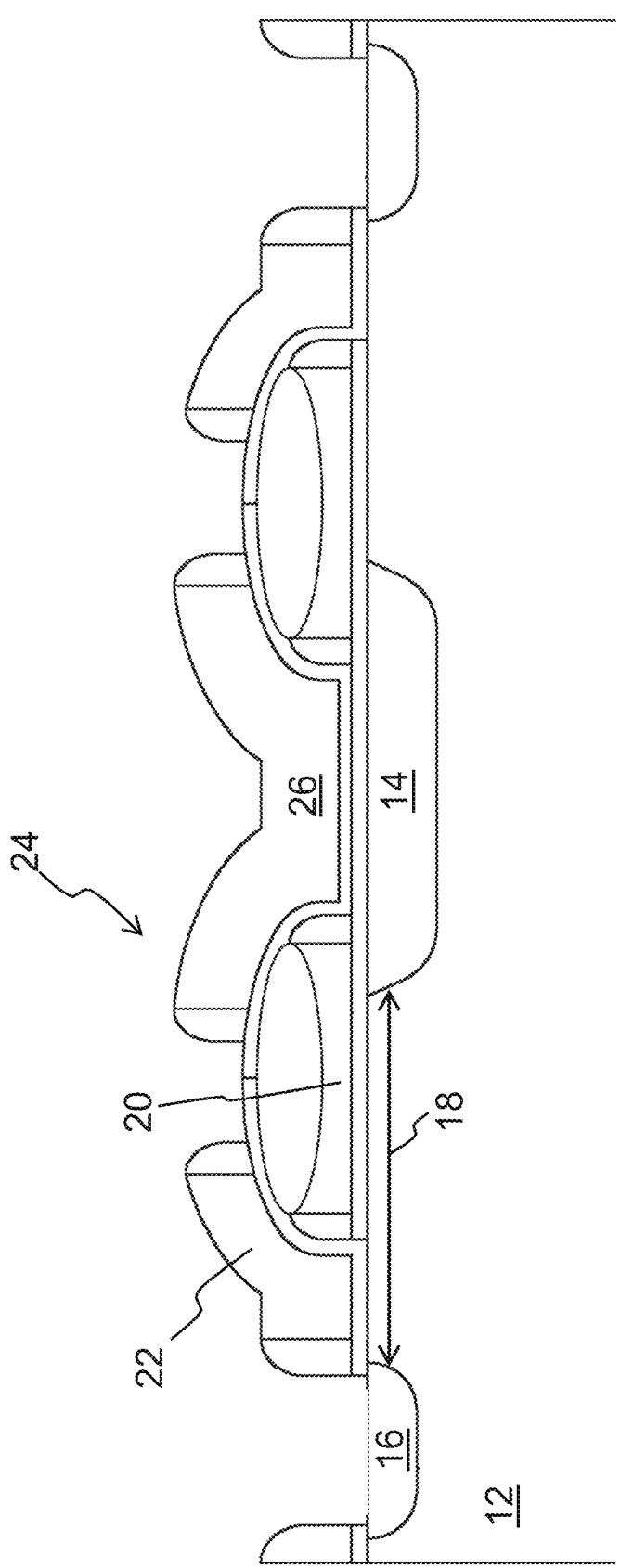
FIG. 2 is a side cross sectional view of a conventional split gate memory cell having three conductive gates.
Figure 3:
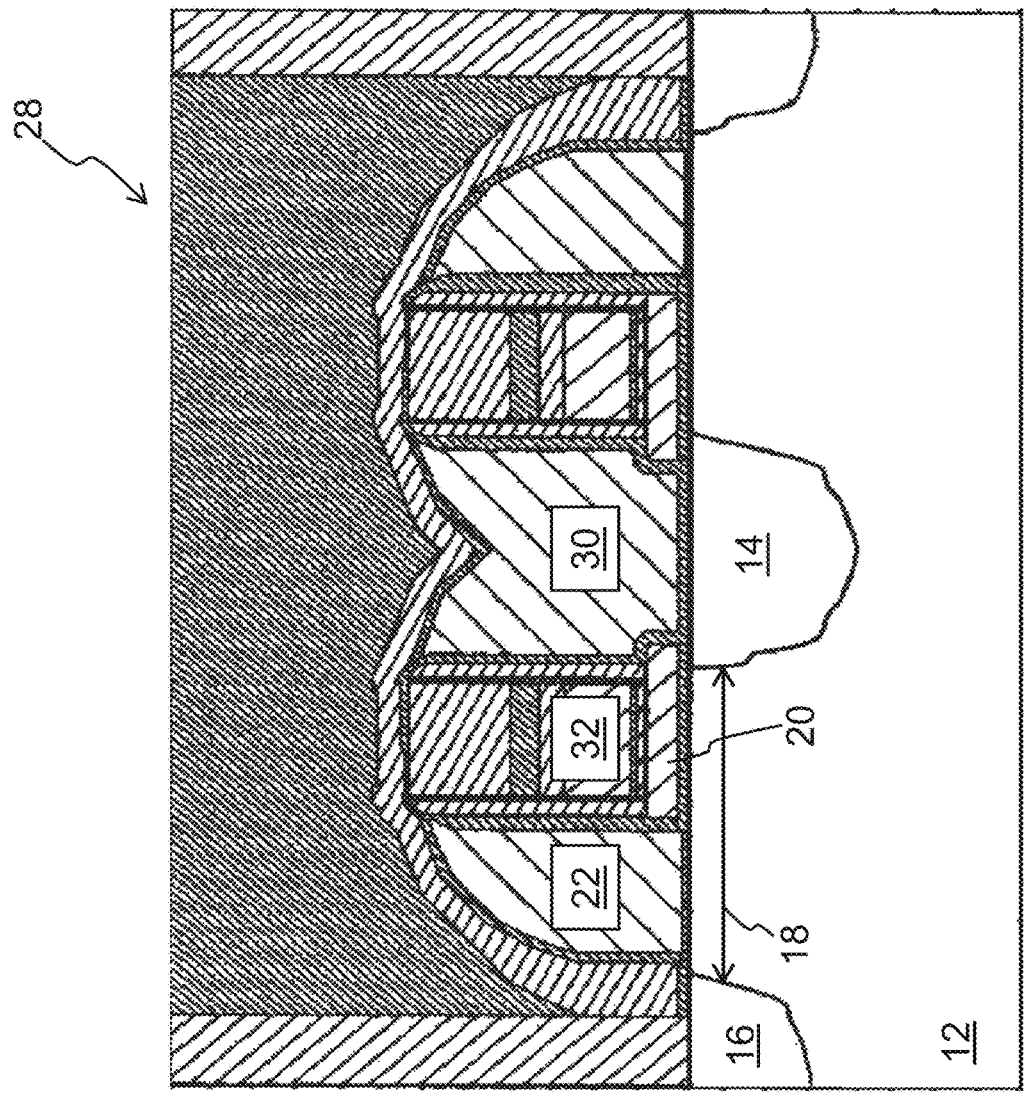
FIG. 3 is a side cross sectional view of a conventional split gate memory cell having four conductive gates.
Figure 5:
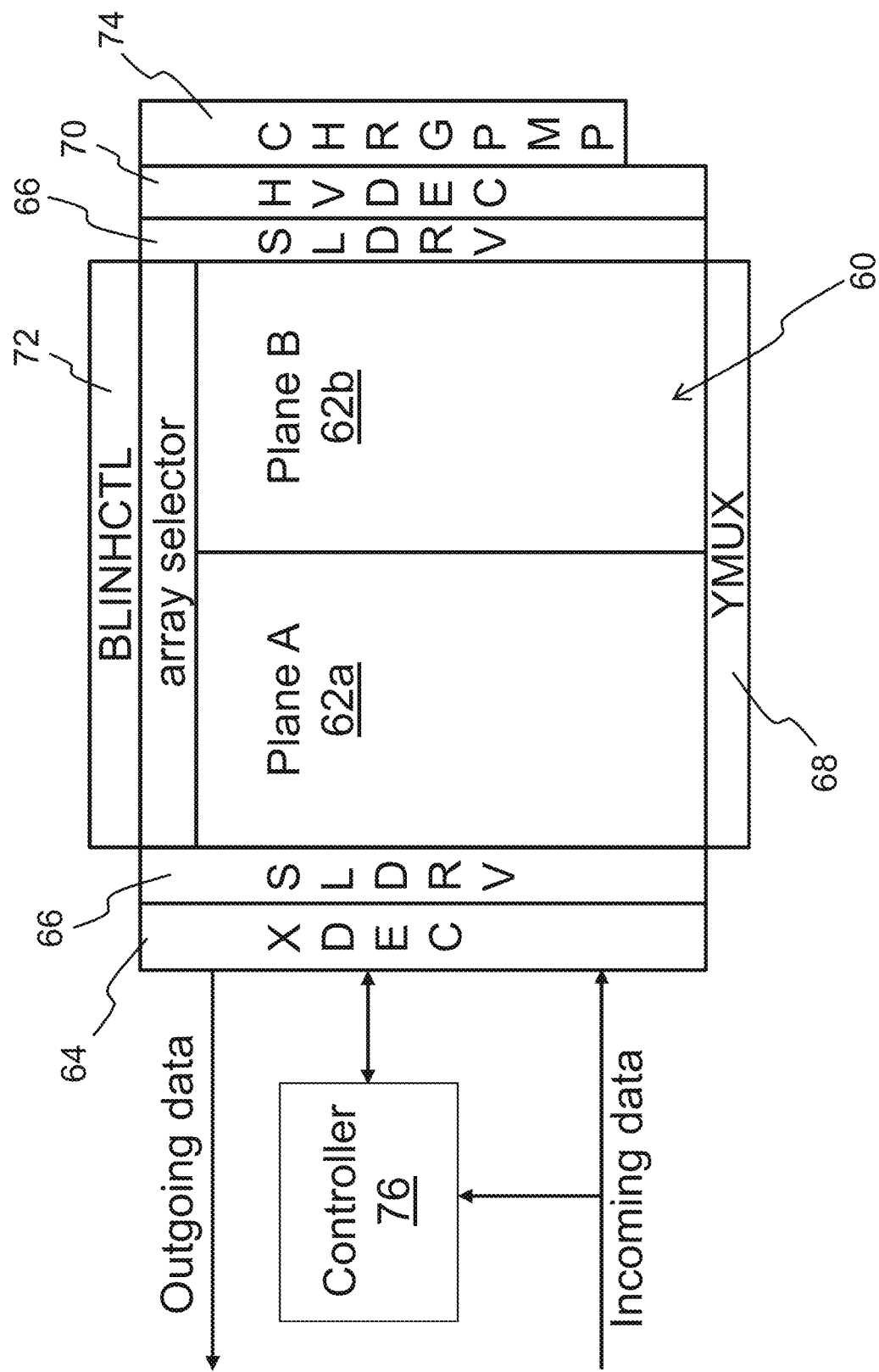
FIG. 5 is a plan view showing the architecture of an exemplary memory device of the present invention.

The architecture of an exemplary memory device is illustrated in FIG. 5. The memory device includes an array 60 of non-volatile memory cells, which can be segregated into two separate planes (Plane A 62a and Plane B 62b). The memory cells can be of the type shown in FIGS. 1-3, formed on a single chip, arranged in a plurality of rows and columns in the semiconductor substrate 12. Adjacent to the array of non-volatile memory cells are address decoders (e.g. XDEC 64 (a row decoder that preferably includes the word line driver 42), SLDRV 66 (a source line driver for driving the source lines), YMUX 68 (a column decoder that preferably includes the bit line driver 44), HVDEC 70 (a high voltage decoder) and a bit line controller (BLINHCTL 72), which are used to decode addresses and supply the various voltages to the various memory cell gates and regions during read, program, and erase operations for selected memory cells. Controller 76 (containing control circuitry) controls the various device elements to implement each operation (program, erase, read) on target memory cells. Charge pump CHRGPMP 74 provides the various voltages used to read, program and erase the memory cells under the control of the controller 76. The control signals on the WL switch control line(s) 50 and the BL switch control line(s) 56 are preferably provided by controller 76.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A memory device, comprising:
a plurality of memory cells arranged in rows and columns;
a plurality of word lines each connected to a row of the memory cells;
a plurality of bit lines each connected to a column of the memory cells;
a word line driver connected to the word lines;
a bit line driver connected to the bit lines;
a plurality of word line switches each disposed on one of the word lines for selectively connecting and disconnecting one of the rows of memory cells to and from the word line driver;
a plurality of bit line switches each disposed on one of the bit lines for selectively connecting and disconnecting one of the columns of memory cells to and from the bit line driver; and
a controller configured to control the plurality of word line switches to connect some but not all of the rows of memory cells to the word line driver at a first point in time, and control the plurality of bit line switches to connect some but not all of the columns of memory cells to the bit line driver at a second point in time.

2. The memory device of claim 1, wherein first point in time is the same as the second point in time.

3. The memory device of claim 1, wherein first point in time is before or after the second point in time.

4. The memory device of claim 1, wherein the plurality of word line switches includes m groups of the word line switches where m is an integer greater than 1, and wherein the controller is configured to:
control the word line switches in a first of the m groups to be in a connected state at the first point in time;
control the word line switches in a second of the m groups to be in a disconnected state at the first point in time;
control the word line switches in the first of the m groups to be in a disconnected state at a third point in time which is after the first point in time; and
control the word line switches in the second of the m groups to be in a connected state at the third point in time.

5. The memory device of claim 4, wherein the word line driver is configured to couple any of the word lines having a word line switch in a connected state to a ground voltage at the first and third points in time.

6. The memory device of claim 1, wherein the plurality of bit line switches includes k groups of the bit line switches where k is an integer greater than 1, and wherein the controller is configured to:
control the bit line switches in a first of the k groups to be in a connected state at the second point in time;
control the bit line switches in a second of the k groups to be in a disconnected state at the second point in time;
control the bit line switches in the first of the k groups to be in a disconnected state at a third point in time which is after the second point in time; and
control the bit line switches in the second of the k groups to be in a connected state at the third point in time.

7. The memory device of claim 6, wherein the bit line driver is configured to charge any of the bit lines having a bit line switch in a connected state to a specific voltage at the second and third points in time.

8. The memory device of claim 6, wherein the bit line driver is configured to couple any of the bit lines having a bit line switch in a connected state to a ground voltage at the second and third points in time.

9. The memory device of claim 6, wherein the bit line driver comprises sense amplifier circuitry configured to sense a voltage or a current on any of the bit lines having a bit line switch in a connected state at the second and third points in time.

10. The memory device of claim 1, wherein the plurality of word line switches includes m groups of the word line switches where m is an integer greater than 1, the plurality of bit line switches includes k groups of the bit line switches where k is an integer greater than 1, and the controller is configured to:
control the word line switches in a first of the m groups to be in a connected state at the first point in time;
control the word line switches in a second of the m groups to be in a disconnected state at the first point in time;
control the word line switches in the first of the m groups to be in a disconnected state at a third point in time which is after the first point in time;
control the word line switches in the second of the m groups to be in a connected state at the third point in time;
control the bit line switches in a first of the k groups to be in a connected state at the second point in time which is the same as the first point in time;
control the bit line switches in a second of the k groups to be in a disconnected state at the second point in time;
control the bit line switches in the first of the k groups to be in a disconnected state at the third point in time; and
control the bit line switches in the second of the k groups to be in a connected state at the third point in time.

11. A memory device, comprising:
a plurality of memory cells arranged in rows and columns;
a plurality of word lines each connected to a row of the memory cells;
a plurality of bit lines each connected to a column of the memory cells;
a word line driver connected to the word lines;
a bit line driver connected to the bit lines;
a plurality of word line switches each disposed on one of the word lines for selectively connecting and disconnecting one of the rows of memory cells to and from the word line driver; and
a controller configured to control the plurality of word line switches to connect some but not all of the rows of memory cells to the word line driver at a first point in time.

12. The memory device of claim 11, wherein the plurality of word line switches includes m groups of the word line switches where m is an integer greater than 1, and wherein the controller is configured to:
control the word line switches in a first of the m groups to be in a connected state at the first point in time;
control the word line switches in a second of the m groups to be in a disconnected state at the first point in time;

control the word line switches in the first of the m groups to be in a disconnected state at a second point in time which is after the first point in time; and control the word line switches in the second of the m groups to be in a connected state at the second point in time.

13. A memory device, comprising:
a plurality of memory cells arranged in rows and columns;
a plurality of word lines each connected to a row of the memory cells;
a plurality of bit lines each connected to a column of the memory cells;
a word line driver connected to the word lines;
a bit line driver connected to the bit lines;
a plurality of bit line switches each disposed on one of the bit lines for selectively connecting and disconnecting one of the columns of memory cells to and from the bit line driver; and
a controller configured to control the plurality of bit line switches to connect some but not all of the columns of memory cells to the bit line driver at a first point in time.

14. The memory device of claim 13, wherein the plurality of bit line switches includes k groups of the bit line switches where k is an integer greater than 1, and wherein the controller is configured to:
control the bit line switches in a first of the k groups to be in a connected state at the first point in time;
control the bit line switches in a second of the k groups to be in a disconnected state at the first point in time;
control the bit line switches in the first of the k groups to be in a disconnected state at a second point in time which is after the first point in time; and
control the bit line switches in the second of the k groups to be in a connected state at the second point in time.

15. A method of operating a memory device that includes:
a plurality of memory cells arranged in rows and columns,
a plurality of word lines each connected to a row of the memory cells,
a plurality of bit lines each connected to a column of the memory cells,
a word line driver connected to the word lines,
a bit line driver connected to the bit lines,
a plurality of word line switches each disposed on one of the word lines for selectively connecting and disconnecting one of the rows of memory cells to and from the word line driver, and
a plurality of bit line switches each disposed on one of the bit lines for selectively connecting and disconnecting one of the columns of memory cells to and from the bit line driver;
the method comprising:
operating the plurality of word line switches to connect some but not all of the rows of memory cells to the word line driver at a first point in time, and
operating the plurality of bit line switches to connect some but not all of the columns of memory cells to the bit line driver at a second point in time.

16. The method of claim 15, wherein the plurality of word line switches includes m groups of the word line switches where m is an integer greater than 1, and wherein the method comprises:
operating the word line switches in a first of the m groups to be in a connected state at the first point in time;
operating the word line switches in a second of the m groups to be in a disconnected state at the first point in time;
operating the word line switches in the first of the m groups to be in a disconnected state at a third point in time which is after the first point in time; and
operating the word line switches in the second of the m groups to be in a connected state at the third point in time.

17. The method of claim 16, further comprising:
coupling any of the word lines having a word line switch in a connected state to a ground voltage at the first and third points in time.

18. The method of claim 15, wherein the plurality of bit line switches includes k groups of the bit line switches where k is an integer greater than 1, and wherein the method comprises:
operating the bit line switches in a first of the k groups to be in a connected state at the second point in time;
operating the bit line switches in a second of the k groups to be in a disconnected state at the second point in time;
operating the bit line switches in the first of the k groups to be in a disconnected state at a third point in time which is after the second point in time; and
operating the bit line switches in the second of the k groups to be in a connected state at the third point in time.

19. The method of claim 18, further comprising:
charging any of the bit lines having a bit line switch in a connected state to a specific voltage at the second and third points in time.

20. The method of claim 18, further comprising:
coupling any of the bit lines having a bit line switch in a connected state to a ground voltage at the second and third points in time.

21. The method of claim 18, further comprising:
sensing a voltage or a current on any of the bit lines having a bit line switch in a connected state at the second and third points in time.

22. The method of claim 15, wherein the plurality of word line switches includes m groups of the word line switches where m is an integer greater than 1, and the plurality of bit line switches includes k groups of the bit line switches where k is an integer greater than 1, the method comprising:
operating the word line switches in a first of the m groups to be in a connected state at the first point in time;
operating the word line switches in a second of the m groups to be in a disconnected state at the first point in time;
operating the word line switches in the first of the m groups to be in a disconnected state at a third point in time which is after the first point in time;
operating the word line switches in the second of the m groups to be in a connected state at the third point in time;
operating the bit line switches in a first of the k groups to be in a connected state at the second point in time which is the same as the first point in time;
operating the bit line switches in a second of the k groups to be in a disconnected state at the second point in time;
operating the bit line switches in the first of the k groups to be in a disconnected state at the third point in time; and
operating the bit line switches in the second of the k groups to be in a connected state at the third point in time.

* * * * *